United States Patent
Zhang et al.

(10) Patent No.: US 12,243,713 B2
(45) Date of Patent: Mar. 4, 2025

(54) ANTI-BREAKDOWN ION SOURCE DISCHARGE APPARATUS

(71) Applicant: JIANGSU LEUVEN INSTRUMENTS CO. LTD, Xuzhou (CN)

(72) Inventors: Yaoyao Zhang, Xuzhou (CN); Dongdong Hu, Xuzhou (CN); Jun Zhang, Xuzhou (CN); Na Li, Xuzhou (CN); Haiyang Liu, Xuzhou (CN); Shiran Cheng, Xuzhou (CN); Song Guo, Xuzhou (CN); Kaidong Xu, Xuzhou (CN)

(73) Assignee: JIANGSU LEUVEN INSTRUMENTS CO. LTD, Xuzhou (CN)

( * ) Notice: Subject to any disclaimer, the term of this patent is extended or adjusted under 35 U.S.C. 154(b) by 208 days.

(21) Appl. No.: 17/999,549

(22) PCT Filed: May 19, 2021

(86) PCT No.: PCT/CN2021/094603
§ 371 (c)(1),
(2) Date: Nov. 21, 2022

(87) PCT Pub. No.: WO2021/233334
PCT Pub. Date: Nov. 25, 2021

(65) Prior Publication Data
US 2023/0207260 A1    Jun. 29, 2023

(30) Foreign Application Priority Data

May 22, 2020   (CN) .......................... 202010441767.3

(51) Int. Cl.
*H01J 37/305*   (2006.01)
*H01J 37/30*    (2006.01)

(52) U.S. Cl.
CPC ...... *H01J 37/3053* (2013.01); *H01J 37/3007* (2013.01)

(58) Field of Classification Search
None
See application file for complete search history.

(56) References Cited

U.S. PATENT DOCUMENTS 3,417,245 A  * 12/1968 Schmidt .................. H05H 3/06
                                                           376/156
3,760,225 A  *  9/1973 Ehlers ............... H01J 37/32055
                                                           315/98

(Continued)

FOREIGN PATENT DOCUMENTS

| CN | 103578905 A | 2/2014 |
|----|-------------|--------|
| CN | 104299870 A | 1/2015 |

(Continued)

OTHER PUBLICATIONS

International Search Report and Written Opinion issued in International Application No. PCT/CN2021/094603, mailed Aug. 4, 2021; 11 pgs.

*Primary Examiner* — Srinivas Sathiraju
(74) *Attorney, Agent, or Firm* — HAUPTMAN HAM, LLP

(57) ABSTRACT

An anti-breakdown ion source discharge apparatus includes a discharge chamber, a coil support, an upper insulation fixing block, a discharge component and an ion source chamber. The discharge component includes a radio-frequency coil, a lower conductive connector and an upper conductive connector. The radio-frequency coil is fixed on a coil support base; the coil support base is clamped on an inner wall of the bottom of the ion source base; the coil support is along the circumference of the coil support base; the radio-frequency coil passes through the coil support; the upper conductive connector passes by the radio-frequency (Continued)

coil and the coil support base from the outside of the radio-frequency coil and extends into the bottom of the discharge chamber; and the upper insulation fixing block is sleeved over the upper conductive connector and is fixed on the inner wall of the bottom of the ion source chamber.

10 Claims, 5 Drawing Sheets

(56) References Cited

U.S. PATENT DOCUMENTS

| | | | | |
|---|---|---|---|---|
| 3,924,134 | A * | 12/1975 | Uman | H01J 37/08 315/111.41 |
| 3,949,230 | A * | 4/1976 | Bach | H01J 27/04 313/360.1 |
| 5,216,330 | A * | 6/1993 | Ahonen | H01J 27/16 315/111.21 |
| 2011/0147200 | A1* | 6/2011 | Hirayanagi | H01J 27/024 250/398 |
| 2012/0104274 | A1* | 5/2012 | Hirayanagi | H01J 37/08 250/424 |
| 2015/0188296 | A1* | 7/2015 | Zhang | G01N 27/622 250/288 |
| 2018/0138007 | A1* | 5/2018 | Hahto | H01J 37/08 |
| 2019/0341288 | A1* | 11/2019 | Che | H01L 21/67069 |
| 2020/0161088 | A1* | 5/2020 | Li | H01J 37/305 |
| 2020/0291512 | A1* | 9/2020 | Price | C23C 16/45555 |
| 2022/0064793 | A1* | 3/2022 | Jones | C23C 16/0209 |
| 2022/0254605 | A1* | 8/2022 | Liu | H01J 37/3244 |
| 2022/0254615 | A1* | 8/2022 | Li | H01J 37/32862 |
| 2022/0375733 | A1* | 11/2022 | Liu | H01J 37/32862 |
| 2023/0207250 | A1* | 6/2023 | Zhang | H01J 37/3053 250/424 |
| 2023/0207260 | A1* | 6/2023 | Zhang | H05H 7/08 |
| 2023/0207283 | A1* | 6/2023 | Guo | H01J 37/32119 219/201 |
| 2023/0207284 | A1* | 6/2023 | Guo | H05B 1/023 156/345.24 |
| 2023/0238218 | A1* | 7/2023 | Liu | H01J 37/32449 239/553 |
| 2023/0352267 | A1* | 11/2023 | Liu | H01J 37/32477 |

FOREIGN PATENT DOCUMENTS

| | | | | |
|---|---|---|---|---|
| CN | 106653282 | A | 5/2017 | |
| CN | 107093542 | A | 8/2017 | |
| CN | 206774500 | U | 12/2017 | |
| CN | 206834151 | U * | 1/2018 | H01J 37/08 |
| CN | 207233954 | U | 4/2018 | |
| CN | 109087840 | A * | 12/2018 | H01J 37/08 |
| CN | 109755085 | A | 5/2019 | |
| CN | 110113856 | A | 8/2019 | |
| CN | 110459925 | A | 11/2019 | |
| CN | 210223933 | U * | 3/2020 | H01J 37/08 |
| CN | 109087840 | B * | 11/2023 | H01J 37/08 |
| JP | 2015050362 | A | 3/2015 | |
| WO | 2015047722 | A1 | 4/2015 | |
| WO | WO-2021233337 | A1 * | 11/2021 | H01J 37/08 |

* cited by examiner

ANTI-BREAKDOWN ION SOURCE DISCHARGE APPARATUS

RELATED APPLICATIONS

The present application is a U.S. National Phase of International Application Number PCT/CN2021/094603, filed May 19, 2021, and claims priority to Chinese Application Number 202010441767.3, filed May 22, 2020.

TECHNICAL FIELD

The present disclosure relates to the field of mechanically machining equipment, and in particular to an anti-breakdown ion source discharge apparatus.

BACKGROUND

An ion source apparatus is a device that ionizes neutral atoms or molecules and extracts ion beams therefrom. The ion beams are widely used in ion beam etching because of its advantages such as the accurate trajectory control, the high ionization efficiency, the excellent beam uniformity, the wide range of energy adjustment, and the compatibility with reaction gases, and therefore, the performance of the ion source apparatus has a crucial impact on the effect of the ion implantation. The operation principle of the radio-frequency ion source apparatus is as follows: the gas is ionized by the radio-frequency power supply to form plasma in the discharge chamber, the multi-aperture grid generates an accelerating electric field, and the ions are neutralized by the neutralizer after being extracted and accelerated by the accelerating electric field to form a plasma beam. In the radio-frequency ion source apparatus produced by KRI, a longer copper sheet is adopted for an electric connection between the upper radio-frequency column 8 and the radio-frequency coil 3; and a shorter copper sheet 4 is adopted for an electric connection between the lower radio-frequency column 9 and the radio-frequency coil 3. As the copper sheets are thin and unfixed, the longer copper sheet and the shorter copper sheet naturally droop below the discharge chamber 1 (as illustrated in FIG. 1), such that the distance between the discharge chamber and the copper sheets is uncontrollable. When the distance between the discharge chamber and the copper sheets is relatively close, the discharge chamber will be broken down under a long-term effect of the electric field, thereby increasing the production cost.

SUMMARY

The objectives of the present disclosure are to provide an anti-breakdown ion source discharge apparatus to prevent the discharge chamber from being broken down. In order to achieve the above objectives, the following technical solutions are adopted in the present disclosure.

Provided is an anti-breakdown ion source discharge apparatus. The apparatus includes a discharge chamber sleeved with an ion source chamber; a region configured to place a discharge component is enclosed between the discharge chamber and the ion source chamber.

The discharge component includes a radio-frequency coil, a lower conductive connecting part and an upper conductive connecting part.

The radio-frequency coil is sleeved on an exterior of the discharge chamber; and the radio-frequency coil is fixed on a coil support base.

One end of the lower conductive connecting part is connected to the tail end of the radio-frequency coil through a lower connecting plate, and the other end of the lower conductive connecting part is connected to a lower radio-frequency column; and the lower radio-frequency column is fixed on an inner wall at a bottom of the ion source chamber.

One end of the upper conductive connecting part is connected to a head end of the radio-frequency coil through an upper connecting plate, the other end of the upper conductive connecting part is connected to an upper radio-frequency column; and the upper radio-frequency column is fixed on the inner wall at the bottom of the ion source chamber.

The apparatus further includes a coil support configured to support the radio-frequency coil and arranged along a circumferential direction of the coil support base. The coil support base is locked on the inner wall at the bottom of the ion source chamber. The radio-frequency coil passes through the coil support. The upper conductive connecting part sequentially crosses over the radio-frequency coil and the coil support base from an exterior of the radio-frequency coil, and extends into a bottom of the discharge chamber through a bottom of the coil support base.

The apparatus further includes an upper insulation fixing element configured to fix the upper conductive connecting part. The upper insulation fixing element is sleeved on the upper conductive connecting part and fixed on the inner wall at the bottom of the ion source chamber.

Preferably, the anti-breakdown ion source discharge apparatus further includes a lower insulation fixing element, and the lower insulation fixing element is sleeved on the lower conductive connecting part and fixed on the inner wall at the bottom of the ion source chamber.

Preferably, the lower conductive connecting part sequentially crosses over the radio-frequency coil and the coil support base from the exterior of the radio-frequency coil and extends into the bottom of the discharge chamber through the bottom of the coil support base.

Preferably, the upper connecting plate is horizontally arranged; and the upper connecting plate is provided with a threaded hole configured to install the upper conductive connecting part.

Preferably, the upper conductive connecting part is L-shaped. The upper conductive connecting part includes a vertical section and a horizontal section connected with the vertical section, and the vertical section is located outside the radio-frequency coil and the coil support base.

Preferably, the coil support base is movable along an axial direction of the ion source chamber. The vertical section is provided with a moving channel. An upper conductive mobile part is arranged inside the moving channel. The upper conductive mobile part is connected to the upper connecting plate.

Preferably, one end of the upper conductive mobile part connected to the upper connecting plate is in a convex structure.

Preferably, the anti-breakdown ion source discharge apparatus further includes a hydraulic cylinder fixed at a bottom outside the ion source chamber, wherein a hydraulic rod of the hydraulic cylinder passes through the ion source chamber and is fixed on the coil support base.

Preferably, a chamfer radius at the bottom of the discharge chamber is greater than or equal to 15 mm.

Compared with the prior art, the advantages of the present disclosure lie in the following.

(1) The fact that the upper conductive connecting part is fixed at the bottom of the ion source chamber through the upper insulation fixing element, and the lower conductive connecting part is fixed at the bottom of the ion source chamber through the lower insulation fixing element, avoids the droop phenomenon of the upper conductive connecting part and the lower conductive connecting part, and increases the distance between the upper conductive connecting part and the bottom of the discharge chamber as well as the distance between the lower conductive connecting part and the bottom of the discharge chamber.

(2) Both the upper conductive connecting part and the lower conductive connecting part are installed from the outside of the radio-frequency coil, which, compared to the installation from the inside of the radio-frequency coil, increases the distance between the upper conductive connecting part and the bottom of the discharge chamber as well as the distance between the lower conductive connecting part and the bottom of the discharge chamber.

(3) The increase of the chamfer radius at the bottom of the discharge chamber can effectively lengthen the distance L between the discharge chamber and the upper conductive connecting part, and the distance L between the discharge chamber and the lower conductive connecting part.

(4) During the radio-frequency performance adjustment, under the action of the hydraulic cylinder, the radio-frequency coil moves axially along the discharge chamber along with the hydraulic cylinder. The upper conductive mobile part slides along and in the channel on the vertical section of the upper conductive connecting part driven by the upper connecting plate, and the lower conductive mobile part slides along and in the channel on the vertical section of the lower conductive connecting part driven by the lower connecting plate. Therefore, the distance between the radio-frequency coil and the Grid assembly can be effectively adjusted to avoid the disadvantages of the manual adjustment for disassembling the machine.

1. Discharge chamber; 2. Ion source chamber; 3. Radio-frequency coil; 4. Upper conductive connecting part; 41. Horizontal section; 42. Vertical section; 5. Lower conductive connecting part; 6. Upper connecting plate; 7. Lower connecting plate; 8. Upper radio-frequency column; 9. Lower radio-frequency column; 10. Coil support; 11. Coil support base; 12. Upper insulation fixing element; 13. Lower insulation fixing element; 14. Upper conductive mobile part; 141. Connecting projection; 15. Hydraulic cylinder; 16. Grid assembly.

DETAILED DESCRIPTION OF THE EMBODIMENTS

The present disclosure will be described in more detail below in combination with the schematic diagram, in which the preferred embodiments of the present disclosure are illustrated. It should be understood that those skilled in the art would modify the present disclosure described herein, while still realizing the beneficial effects of the present disclosure. Therefore, the following description should be understood as broad knowledge for those skilled in the art, not as a limitation on the present disclosure.

Figure 1:
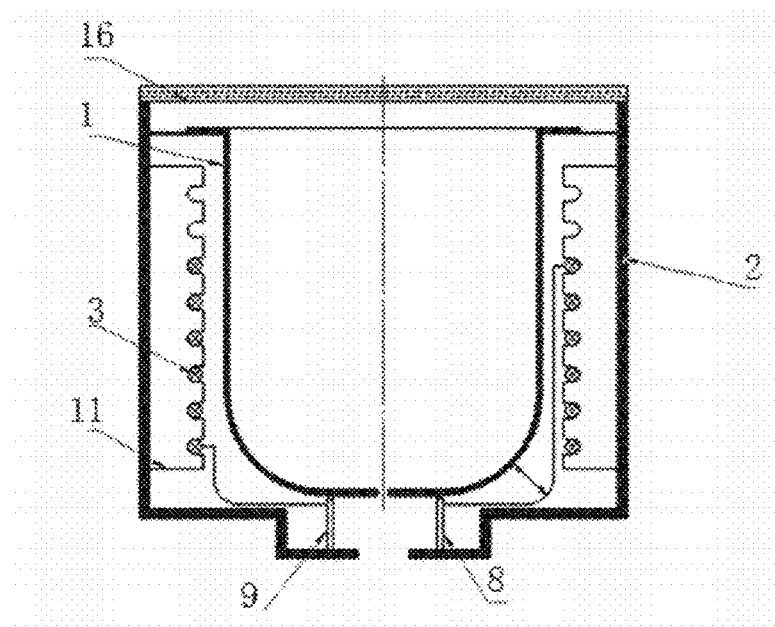
FIG. 1 illustrates a sectional view of an ion source discharge apparatus in the prior art.

In this embodiment, on the basis of the prior art (as illustrated in FIG. 1), the following measures are taken to increase the distance between the upper conductive connecting part 4 and the bottom of the discharge chamber 1, and the distance between the lower conductive connecting part 5 and the bottom of the discharge chamber 1, specifically are that: 1) the structure of the coil support base 11 is optimized; 2) the upper insulation fixing element 12 and the lower insulation fixing element 13 are added; 3) the installation fashions of the upper conductive connecting part 4 and the lower conductive connecting part 5 are changed at the same time; and 4) the chamfer radius at the bottom of the discharge chamber 1 is increased.

Figure 2:
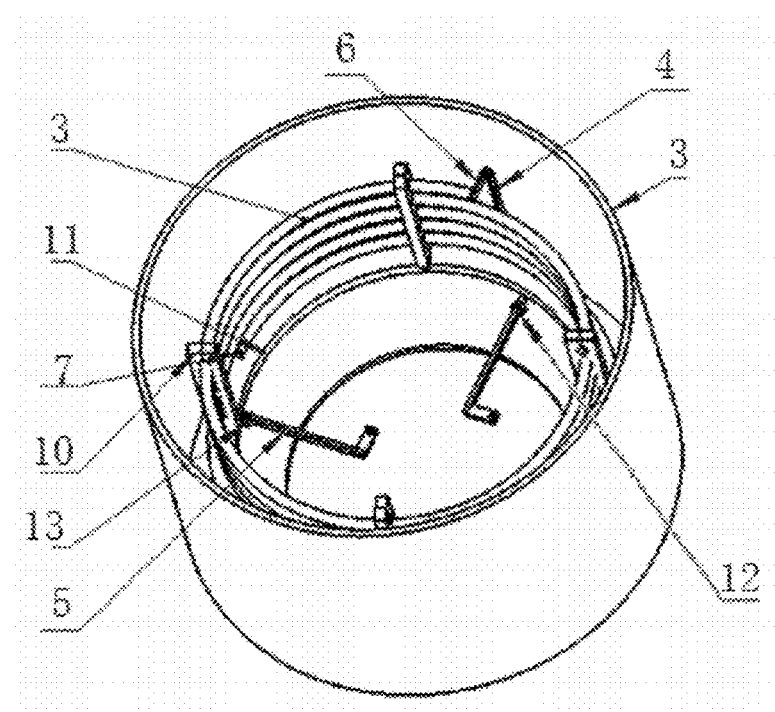
FIG. 2 illustrates a perspective view of an ion source chamber and a discharge component in an anti-breakdown ion source discharge apparatus according to an embodiment of the present disclosure.
Figure 3:
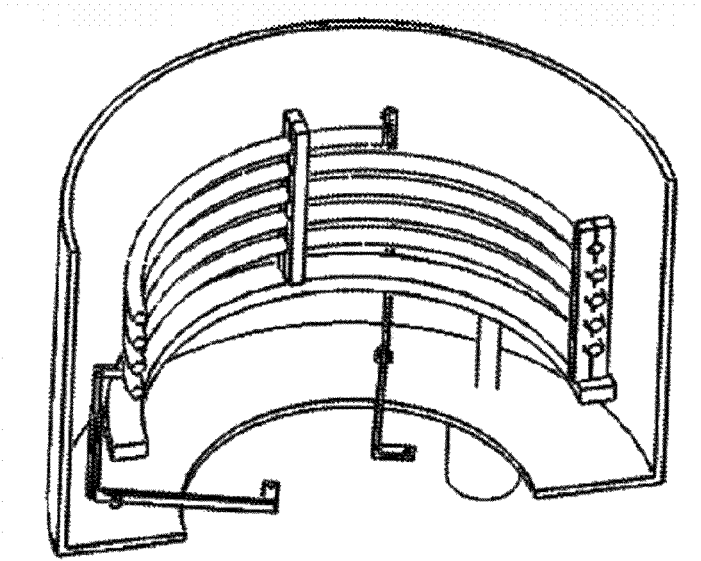
FIG. 3 illustrates a sectional view of FIG. 2.
Figure 4:
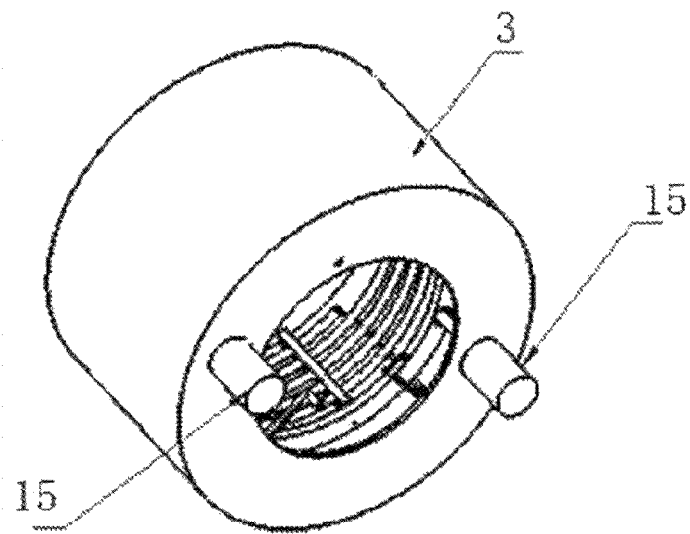
FIG. 4 illustrates another perspective view of FIG. 2.

As illustrated in FIGS. 2 to 4, the anti-breakdown ion source discharge apparatus includes a discharge chamber 1, an ion source chamber 2, a discharge component, a coil support 10, an upper insulation fixing element 12, and a lower insulation fixing element 13.

The discharge chamber 1 is sleeved with the ion source chamber 2. A region configured to place a discharge component is enclosed by the discharge chamber 1 and the ion source chamber 2. The chamfer radius at the bottom of the discharge chamber 1 is greater than or equal to 15 mm.

The discharge component includes a radio-frequency coil 3, a lower conductive connecting part 5 and an upper conductive connecting part 4. The radio-frequency coil 3 is sleeved on an exterior of the discharge chamber 1. The radio-frequency coil 3 is fixed on the coil support base 1.

The coil support 10 is configured to support the radio-frequency coil 3 and arranged along a circumferential direction of the coil support base 11. The coil support base 11 is locked on the inner wall at the bottom of the ion source chamber 2. The radio-frequency coil 3 passes through the coil support 10. In this embodiment, the coil support base 11 is movably connected with the ion source chamber 2, that is, the coil support base 11 is axially movable along the ion source chamber 2 to adjust the distance between the radio-frequency coil 3 and the Grid assembly 16. In other embodiments other than this one, when the distance between the radio-frequency coil 3 and the Grid assembly 16 is not required, the coil support base 11 may also be locked or fixed on the inner wall at the bottom of the ion source chamber 2. In order to avoid the conductivity of other portions of the radio-frequency coil 3, the materials of the coil support base 11 and the coil support 10 should be selected from insulating materials such as ceramic and quartz.

One end of the lower conductive connecting part 5 is connected to the tail end of the radio-frequency coil 3 through the lower connecting plate 7, and the other end of the lower conductive connecting part 5 is connected to the lower radio-frequency column 9. The lower radio-frequency column 9 is fixed on the inner wall at the bottom of the ion source chamber 2. The lower conductive connecting part 5 sequentially crosses over the radio-frequency coil 3 and the coil support base 11 from the outside of the radio-frequency coil 3 and extends into the bottom of the discharge chamber 1 through the bottom of the coil support base 11. In this embodiment, the lower conductive connecting part 5 and the lower connecting plate 7 are threadly connected with each other. A welding fashion is adopted between the lower connecting plate 7 and the tail end of the radio frequency coil 3.

One end of the upper conductive connecting part 4 is connected to the head end of the radio-frequency coil 3 through the upper connecting plate 6, and the other end of the upper conductive connecting part 4 is connected to the upper radio-frequency column 8. The upper radio-frequency column 8 is fixed on the inner wall at the bottom of the ion source chamber 2. The upper conductive connecting part 4 sequentially crosses over the radio-frequency coil 3 and the coil support base 11 from the outside of the radio-frequency coil 3 and extends into the bottom of the discharge chamber 1 through the bottom of the coil support base 11. In this embodiment, the upper conductive connecting part 4 and the upper connecting plate 6 are threadly connected with each other. A welding fashion is adopted between the upper connecting plate 6 and the head end of the radio frequency coil 3.

The upper insulation fixing element 12 is configured to fix the upper conductive connecting part 4, and the upper insulation fixing element 12 is sleeved on the upper conductive connecting part 4 and fixed on the inner wall at the bottom of the ion source chamber 2.

The lower insulation fixing element 13 is configured to fix the lower conductive connecting part 5, and the lower insulation fixing element 13 is sleeved on the lower conductive connecting part 5 and fixed on the inner wall at the bottom of the ion source chamber 2.

Preferably, the upper connecting plate 6 is horizontally arranged; and the upper connecting plate 6 is provided with a threaded hole configured to install the upper conductive connecting part 4. The lower connecting plate 7 is horizontally arranged; and the lower connecting plate 7 is provided with a threaded hole configured to install the lower conductive connecting part 5. Neither the upper connecting plate 6 nor the lower connecting plate 7 is conductive.

In the prior art, during the radio-frequency performance adjustment, it is required to move the radio-frequency coil 3, the coordinates of the upper radio-frequency column 8 and the lower radio-frequency column 9 remain unchanged, and the position coordinates of the radio-frequency coil 3 is required to be changed. Therefore, the length of the longer copper sheet (similar to the upper conductive connecting part 4) configured to connect the radio-frequency coil 3 and the upper radio-frequency column 8 as well as the length of the shorter copper sheet (similar to the lower conductive connecting part 5) configured to connect the radio-frequency coil 3 and the lower radio-frequency column 9 are required to be changed. However, the length of the longer copper sheet and the length of the shorter copper sheet are limited. Therefore, when connecting the radio-frequency coil 3 with the upper radio-frequency column 8 and the lower radio-frequency column 9, the length of the copper sheet is required to be replaced manually, and the operation is tedious.

In this embodiment, the automatic adjustment of the distance between the radio-frequency coil 3 and the Grid assembly 16 is realized by adding the hydraulic cylinders 15 and setting the adjustable lengths of the upper conductive connecting part 4 and the lower conductive connecting part 5. The specific solutions are as follows.

Figure 5A:
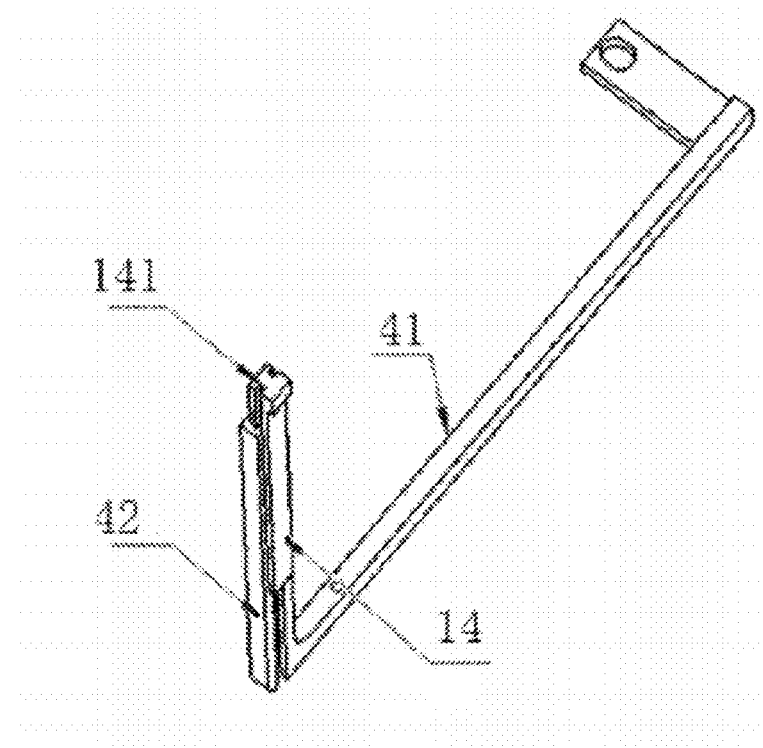
FIGS. 5(a) to 5(b) illustrate perspective views of the upper mobile connecting part in FIG. 1.
Figure 5B:
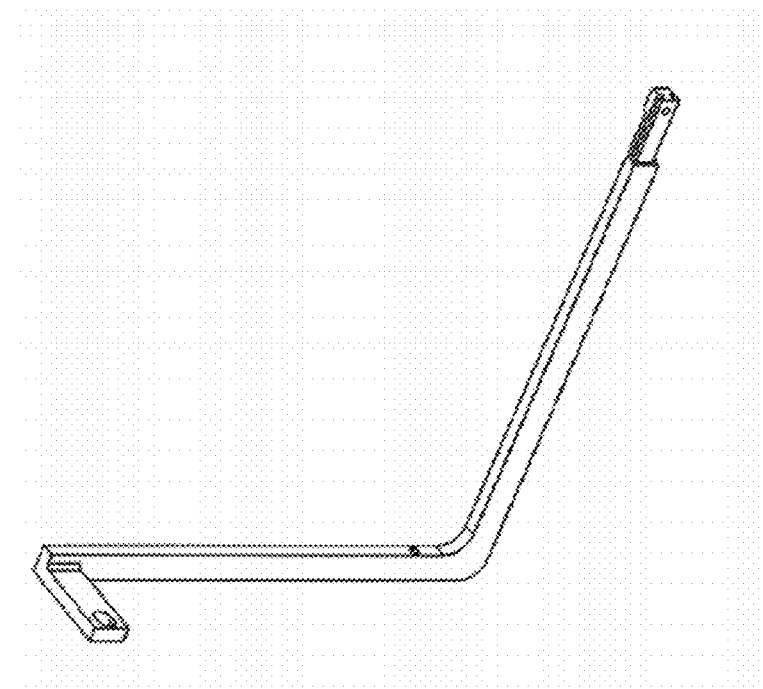

As illustrated in FIGS. 5(a) to 5(b), the upper conductive connecting part 4 is L-shaped. The upper conductive connecting part 4 includes a vertical section 42 and a horizontal section 41 connected with the vertical section 42. The vertical section 42 is located in an exterior of the radio-frequency coil 3 and the coil support base 11. In this embodiment, the coil support base 11 is movably connected with the ion source chamber 2, that is, the coil support base 11 is axially movable along the ion source chamber 2 to adjust the distance between the radio-frequency coil 3 and the Grid assembly 16. That is, the coil support base 11 is movable along the axial direction of the ion source chamber 2. The vertical section 42 is provided with a moving channel. The upper conductive mobile part 14 is installed in the moving channel. The upper conductive mobile part 14 is connected to the upper connecting plate 6. As illustrated in FIG. 6, a hydraulic cylinder 15 is added at the bottom of the ion source chamber 2, and the hydraulic cylinder 15 is fixed at the bottom outside the ion source chamber 2. The hydraulic rod of the hydraulic cylinder 15 passes through the ion source chamber 2 and is fixed on the coil support base 11.

During the radio-frequency performance adjustment, under the action of the hydraulic cylinders 15, the radio-frequency coil 3 moves axially along the discharge chamber 1 along with the hydraulic cylinders 15. The upper conductive mobile part 14 slides along and in the channel on the vertical section 42 of the upper conductive connecting part 4 driven by the upper connecting plate 6, and the lower conductive mobile part slides along and in the channel on the vertical section 42 of the lower conductive connecting part 5 driven by the lower connecting plate 7. Therefore, the distance between the radio-frequency coil 3 and the Grid assembly 16 can be effectively adjusted to avoid the disadvantage of manual adjustment for disassembling the machine.

In this embodiment, the number of hydraulic cylinders 15 is set to 2 and the hydraulic cylinders are symmetrically arranged.

Figure 6A:
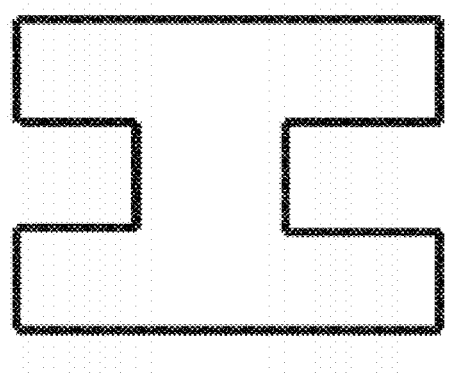
FIG. 6(a) illustrates a cross-sectional view of an end of the upper conductive mobile part, which is connected with the vertical section in an embodiment of the present disclosure.
Figure 6B:
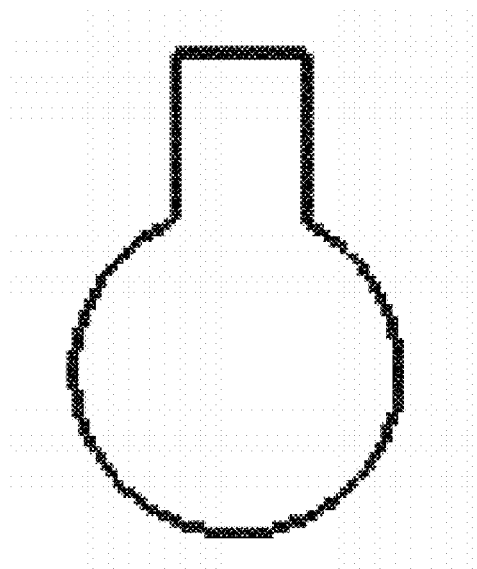
FIGS. 6(b) to 6(c) illustrate cross-sectional views of the upper conductive mobile parts in other embodiments of the present disclosure.
Figure 6C:
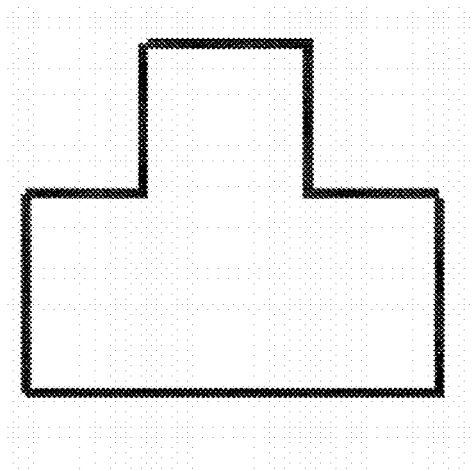
Figure 7A:
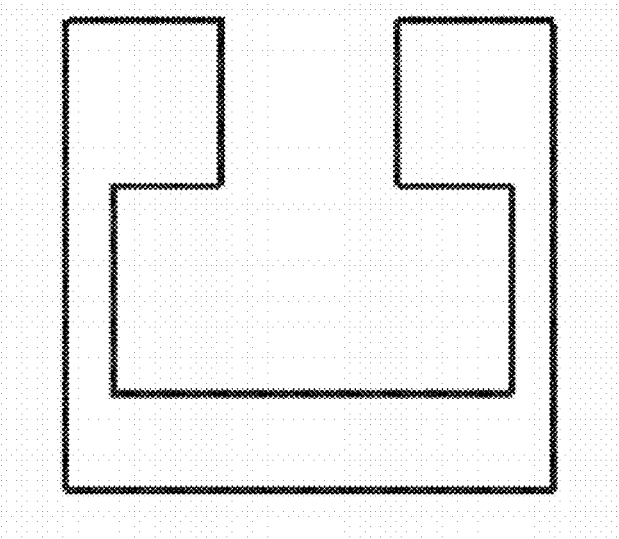
FIG. 7(a) illustrates a cross-sectional view of an end of the vertical section, which is connected to the conductive mobile part in an embodiment of the present disclosure.
Figure 7B:
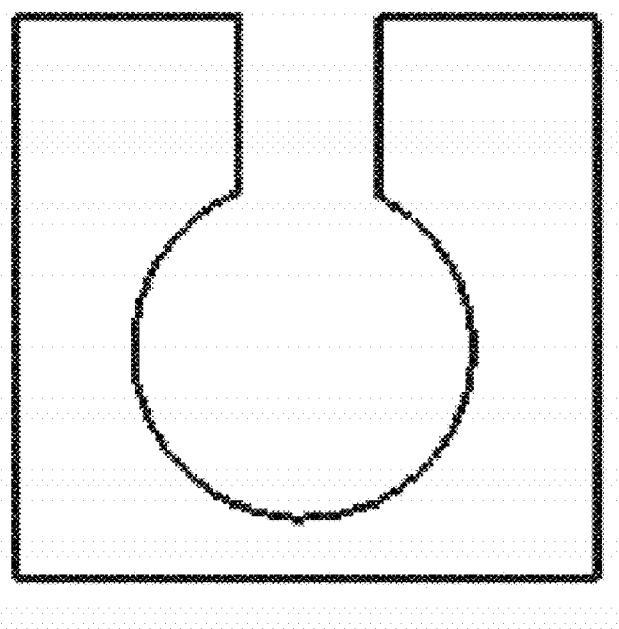
FIG. 7(b) illustrates a cross-sectional view of a vertical section in other embodiments of the present disclosure.

As illustrated in FIG. 6(a), in this embodiment, one end of the upper conductive mobile part 14 connected to the upper connecting plate 6 is in a convex structure, that is, the connection projection 141, and the upper conductive connecting part 4 is in a convex groove structure as illustrated in FIG. 7(a), which can effectively increase the contact area between the upper conductive mobile part 14 and the upper conductive connecting part 4, thereby avoiding the problem of poor contact. As illustrated in FIG. 6(b), in other embodiments other than this one, when the cross section of the upper conductive mobile part 14 is a circular protruding keyway and the cross section of the upper conductive connecting part 4 is a circular groove as illustrated in FIG. 7(b), the relative sliding can also be satisfied and the contact is excellent. In other embodiments other than this one, the cross section of the upper conductive mobile part 14 is as illustrated in FIG. 6(c).

The above description is only preferred embodiments of the present disclosure and does not have any limiting effect on the present disclosure. Any form of equivalent replacements or modifications made by those skilled in the art to the technical solutions and technical contents disclosed by the present disclosure within the scope of the technical solutions of the present disclosure, belongs to the contents that are not separated from the technical solutions of the present disclosure, and still belongs to the protection scope of the present disclosure.

What is claimed is:

1. An anti-breakdown ion source discharge apparatus, comprising a discharge chamber, wherein the discharge chamber is sleeved with an ion source chamber; and a region configured to place a discharge component is enclosed between the discharge chamber and the ion source chamber;
   the discharge component includes a radio-frequency coil, a lower conductive connecting part and an upper conductive connecting part;
   the radio-frequency coil is sleeved on an exterior of the discharge chamber; and the radio-frequency coil is fixed on a coil support base;
   one end of the lower conductive connecting part is connected to a tail end of the radio-frequency coil through a lower connecting plate, and another end of the lower conductive connecting part is connected to a lower radio-frequency column; and the lower radio-frequency column is fixed on an inner wall at a bottom of the ion source chamber; and
   one end of the upper conductive connecting part is connected to a head end of the radio-frequency coil through an upper connecting plate, and another end of the upper conductive connecting part is connected to an upper radio-frequency column; and the upper radio-frequency column is fixed on the inner wall at the bottom of the ion source chamber;
   wherein the apparatus further includes:
   a coil support configured to support the radio-frequency coil and arranged along a circumferential direction of the coil support base; the coil support base is locked on the inner wall at the bottom of the ion source chamber; the radio-frequency coil passes through the coil support; the upper conductive connecting part sequentially crosses over the radio-frequency coil and the coil support base from an outside of the radio-frequency coil and extends into a bottom of the discharge chamber through a bottom of the coil support base; and
   an upper insulation fixing element configured to fix the upper conductive connecting part, wherein the upper insulation fixing element is sleeved on the upper conductive connecting part and fixed on the inner wall at the bottom of the ion source chamber.

2. The anti-breakdown ion source discharge apparatus according to claim 1, wherein the apparatus further comprises a lower insulation fixing element sleeved on the lower conductive connecting part and fixed on the inner wall at the bottom of the ion source chamber.

3. The anti-breakdown ion source discharge apparatus according to claim 2, wherein the lower conductive connecting part sequentially crosses over the radio-frequency coil and the coil support base from the outside of the radio-frequency coil and extends into the bottom of the discharge chamber through the bottom of the coil support base.

4. The anti-breakdown ion source discharge apparatus according to claim 3, wherein the upper connecting plate is horizontally arranged; and the upper connecting plate is provided with a threaded hole configured to install the upper conductive connecting part.

5. The anti-breakdown ion source discharge apparatus according to claim 3, wherein the upper conductive connecting part is L-shaped; the upper conductive connecting part includes a vertical section and a horizontal section connected with the vertical section; and the vertical section is located outside the radio-frequency coil and the coil support base.

6. The anti-breakdown ion source discharge apparatus according to claim 5, wherein the coil support base is movable along an axial direction of the ion source chamber; the vertical section is provided with a moving channel; an upper conductive mobile part is installed in the moving channel; and the upper conductive mobile part is connected to the upper connecting plate.

7. The anti-breakdown ion source discharge apparatus according to claim 6, wherein one end of the upper conductive mobile part connected to the upper connecting plate is in a convex structure.

8. The anti-breakdown ion source discharge apparatus according to claim 6, wherein the apparatus further comprises a hydraulic cylinder fixed at a bottom outside the ion source chamber, and a hydraulic rod of the hydraulic cylinder passes through the ion source chamber and is fixed on the coil support base.

9. The anti-breakdown ion source discharge apparatus according to claim 1, wherein a chamfer radius at the bottom of the discharge chamber is greater than or equal to 15 mm.

10. An anti-breakdown ion source discharge apparatus, comprising:
    an ion source chamber; and
    a discharge chamber, wherein the discharge chamber is sleeved with the ion source chamber, and a region between the discharge chamber and the ion source chamber encloses a discharge component that includes a radio-frequency coil, a lower conductive connecting part, and an upper conductive connecting part, wherein:
    the radio-frequency coil is fixed on a coil support base by a coil support,
    one end of the lower conductive connecting part is connected to a tail end of the radio-frequency coil, and another end of the lower conductive connecting part is connected to a lower radio-frequency column at a bottom of the ion source chamber,
    one end of the upper conductive connecting part is connected to a head end of the radio-frequency coil, and another end of the upper conductive connecting part is connected to an upper radio-frequency column at the bottom of the ion source chamber,
    the radio-frequency coil passes through the coil support,
    the upper conductive connecting part crosses over outsides of the radio-frequency coil and the coil support base,
    an upper insulation fixing element configured to fix a lower portion of the upper conductive connecting part, and
    the radio-frequency coil is configured to move axially along the discharge chamber, the upper conductive connecting part having a first slidable portion configured to extend and shorten the length of the upper conductive connecting part with axial movement of the radio-frequency coil, and the lower conductive connecting part having a second sliceable portion configured to slide with axial movement of the radio-frequency coil.

* * * * *